United States Patent [19]
Hosten

[11] Patent Number: 5,223,116
[45] Date of Patent: Jun. 29, 1993

[54] APPARATUS FOR ELECTROPHORETIC APPLICATION OF A LACQUER ONTO PLATE-SHAPED WORK PIECES

[75] Inventor: Daniel Hosten, Handzame, Belgium

[73] Assignee: Siemens Aktiengesellschaft, Munich, Fed. Rep. of Germany

[21] Appl. No.: 881,167

[22] Filed: May 11, 1992

[51] Int. Cl.$^5$ .............................................. C25D 13/00
[52] U.S. Cl. ...................... 204/300 EC; 204/299 EC; 204/202
[58] Field of Search ................... 204/299 EC, 300 EC, 204/202

[56] References Cited

U.S. PATENT DOCUMENTS

| | | | |
|---|---|---|---|
| 4,322,280 | 3/1982 | Houska et al. | 204/202 |
| 4,402,800 | 9/1983 | Ash et al. | 204/202 |
| 4,755,271 | 7/1988 | Hosten | 204/202 |
| 4,776,939 | 11/1988 | Blasing et al. | 204/202 |
| 4,832,811 | 5/1989 | Hosten | 204/198 |
| 4,948,483 | 8/1990 | Hosten | 204/198 |
| 4,948,486 | 8/1990 | Hosten | 204/198 |

FOREIGN PATENT DOCUMENTS

| | | |
|---|---|---|
| 0254962 | 2/1988 | European Pat. Off. |
| 1577956 | 5/1970 | Fed. Rep. of Germany. |
| 3624481 | 1/1988 | Fed. Rep. of Germany. |
| 3628340 | 1/1988 | Fed. Rep. of Germany. |
| 1514750 | 2/1968 | France. |
| 1080171 | 8/1967 | United Kingdom. |
| 2193727 | 1/1988 | United Kingdom. |

Primary Examiner—John Niebling
Assistant Examiner—Kishor Mayekar
Attorney, Agent, or Firm—Hill, Steadman & Simpson

[57] ABSTRACT

For the electrophoretic application of a lacquer onto plate-shaped work pieces, the work pieces are conveyed on a horizontal throughput path through a cell wherein a lacquer deposition bath and at least one electrode are situated. The anodic or cathodic contacting of the traversing work pieces occurs via an endlessly circulating contacting drive preferably formed by a metal band and via a contact element arranged outside the cell for the feed of the anode current or cathode current to the contacting drive. The lacquer deposited on the contacting drive in the cell is in turn removed via a cleaning arrangement outside the cell and, thus, a reliable contacting of the work pieces is guaranteed. The apparatus is particularly suitable for the electrophoretic application of etching resists, plating resists and solder resists onto printed circuit boards.

21 Claims, 1 Drawing Sheet

APPARATUS FOR ELECTROPHORETIC APPLICATION OF A LACQUER ONTO PLATE-SHAPED WORK PIECES

BACKGROUND OF THE INVENTION

When manufacturing printed circuits and printed circuit boards, there is a fundamental distinction between the widespread subtractive technique, that proceeds on the basis of metal-laminated substrates or base materials and that removes copper not required for conductor tracks by etching, and the additive technique, that proceeds on the basis of adhesive-coated substrates and that applies the interconnect material from baths only to where conductor tracks are required. Combinations of these methods are also known. In all versions, the actual conductive pattern is photolithographically produced by applying, exposing and developing photoresist layers. In traditional light-sensitive photoresist layers, which can be a matter of plating resists or etch resists dependent on the technique employed, the application of the liquid resist material occurs by immersion, roll-on or whirl coating. However, it is also possible to laminate the resist material onto the substrate in the form of what is referred to as a dry film resist using a suitable gluing means.

German reference DE-A-36 28 340 discloses a method for manufacturing printed circuit boards having the desired conductive tracks using a light-sensitive resist film applied on a surface of a copper-plated, insulating substrate. In this method the lightsensitive resist film is electro-deposited onto the surface of the copper-plated substrate by immersing the insulated substrate in a lacquer deposition bath containing, as a main constituent, watersoluble plastics or plastics dispersed in water that cure under the action of light. The structurable resist is electrophoretically applied, whereby such an application is also often referred to as anodic or cathodic electro-dipcoating when used in industrialscale lacquering. The electrophoretic application of the light sensitive resist film occurs in a container that accepts the lacquer deposition bath into which the printed circuit board to be coated and two plate-shaped electrodes, that are spaced from the printed circuit board, are suspended from above the container.

European reference EP-A-0 370 133 discloses that solder resists can be electrophoretically applied onto printed circuit boards in addition to etch resists and plating resists.

In industrial fabrication of printed circuit boards, the electrical application of a lacquer serving as an etch resist, plating resist or solder resist must be capable of being performed in a continuous operation, whereby what are referred to as horizontal continuous-flow systems enable an especially economical employment in the present case as well as in the case of the corresponding electroplating devices. However, known electroplating devices for printed circuit boards fashioned as horizontal continuous-flow systems (see European reference EP-A-0 254 962 or German reference DE-A-36 24 481) cannot be used for the electrophoretic application of a lacquer. This is because, by contrast to voltaically deposited metal layers, the electrophoretically deposited lacquer layers have a high specific resistance and, due to their unavoidable deposition onto the circulating contact elements, prevent a reliable contacting of the printed circuit boards after a short time.

SUMMARY OF THE INVENTION

The present invention provides a solution to the problem of guaranteeing a faultless anodic or cathodic contacting of the work pieces in electrophoretic application of a lacquer onto plate-shaped work pieces in a horizontal continuous-flow system.

In general terms the present invention is an apparatus for the electrophoretic application of a lacquer onto plate-shaped work pieces, particularly onto printed circuit boards, comprising:

a cell for the acceptance of a lacquer deposition bath;

at least one electrode arranged in the cell having a polarity opposite that of the anodically or cathodically contacted work pieces;

a conveyor means for conveying the work pieces through the cell on a horizontal throughput path;

at least one endless contacting drive circulating synchronously with the work pieces for the anodic or cathodic contacting of the traversing work pieces;

at least one contact element arranged outside the cell for the feed of the anode current or cathode current to the contacting drive; and at least one cleaning means arranged outside the cell for removing the lacquer deposited on the contacting drive in the cell.

The advantages obtainable with the present invention are particularly that the use of an endlessly circulating contacting drive allows the lacquer deposited on this contacting drive in the lacquer deposition bath to be in turn removed outside the bath. Also, the feed of current to the contacting drive can be undertaken outside the bath without deterioration due to lacquer depositions. A reliable anodic or cathodic contacting of the traversing work pieces by the contacting drive that is newly cleaned before reentry into the lacquer deposition bath is thus always guaranteed.

Advantageous developments of the present invention are as follows.

Circulating the bath liquid guarantees constantly beneficial deposition conditions. It is especially beneficial to use a bath liquid container arranged outside the cell in the circulation of the bath liquid. A further improvement in the deposition conditions can then be achieved in that the bath liquid from the bath liquid container is separately returned into the region of the cell lying above the throughput path and the region of the cell lying below the throughput path.

Pinch rollers at the discharge side provide for removal of a film of bath liquid situated on the deposited lacquer layer.

A cover provides for completely closing off the cell, whereby the cover, however, can be again hinged open for maintenance purposes and the like.

At least one upper electrode is arranged in the cell above the throughput path and at least one lower electrode is arranged in the cell under the throughput path. This provides for completely uniform deposition conditions on the upper side and on the under side of the throughput work pieces.

The contacting drive can be driven for forming the conveyor means. This eliminates the need for a separate conveyor means for the work pieces.

When contacting drives are arranged at both sides of the throughput path, then the anodic or cathodic contacting of the traversing work pieces is further improved and a reliable guidance of the traversing work pieces is also guaranteed.

The contacting drive can be formed by a metal band or by a metal cable. This provides an especially simple and economical fashioning of the contacting drive.

The contacting drive can slide on a horizontally arranged guide in the region of the cell. This provides for an especially simple guidance of the contacting drive in the region of the cell.

At least one pressure element is arranged in the cell, the at least one pressure element pressing the traversing work pieces against the contacting drive. This provides for a further improvement of the anodic and cathodic contacting of the traversing work pieces. It is thereby especially beneficial when the traversing work pieces are pressed against the contacting drive by pressure rollers These pressure rollers can then be placed obliquely such that a sag of thin work pieces is prevented. These pressure rollers can then also be driven with relatively little outlay in order to form an additional conveyor means.

The contact element can be formed by a rotatably seated contact roller or contact drum. This provides an especially simple and reliable feed of the anode current or cathode current to the contacting drive.

Chemical delacquering of the contacting drive can be undertaken in at least one cleaning means. This provides an especially effective, chemical delacquering of the contacting drive, whereby this chemical delacquering can be undertaken by itself or in addition to a mechanical delacquering with brushes or other mechanical means for removing the lacquer. This chemical delacquering is especially effective when the delacquering means is sprayed onto the contacting drive with the assistance of spray nozzles.

The cleaning means for the chemical delacquering can be followed by at least one cleaning means for rinsing the contacting drive. This reliably prevents residues of the chemical delacquering means from proceeding into the lacquer deposition bath. At least one cleaning means for rinsing the contacting drive can be equipped with spray nozzles for the rinse agent. It is particularly beneficial in the rinsing process to use spray nozzles.

A meander-like guidance of the contacting drive can be provided in the region of the cleaning means. This offers the possibility of lengthening the dwell time of the contacting drive in the region of the cleaning means in a simple manner and thus guarantees an especially effective cleaning of the contacting drive.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
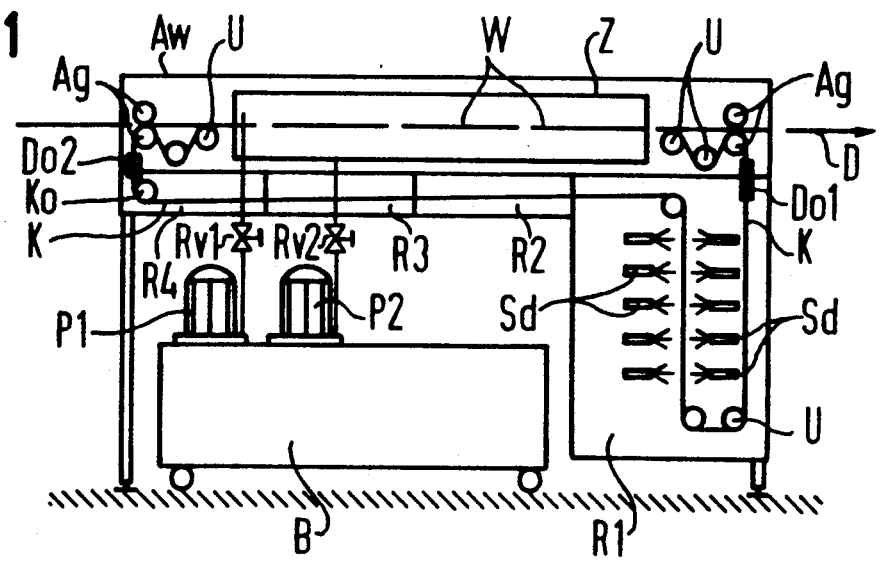
FIG. 1 is a longitudinal section view through an apparatus for the electrophoretic application of a lacquer onto printed circuit boards in a highly simplified, schematic depiction.

According to FIG. 1, the printed circuit boards, referred to as plate-shaped work pieces W, are conveyed in a horizontal attitude and on a horizontal throughput path D through a cell Z that is closed except for the required entry and exit slots, a lacquer deposition bath that is not referenced in detail being situated in this closed cell Z. A bath liquid container B is situated under the cell Z for circulating the bath liquid, the regions of the cell Z above and below the throughput path D being separately charged with bath liquid from this bath liquid container B via pumps P1 and P2 as well as via regulating valves Rv1 and Rv2. The return of the bath liquid from the cell Z or from a collecting tank Aw arranged under the cell Z into the bath liquid container B is not shown in detail in FIG. 1. A respective pair of pinch rollers referenced Aq is situated inside the collecting tank Aw at the entry side preceding the cell Z and at the discharge side following the cell Z.

Dependent on the type of lacquer deposition bath employed, the plate-shaped work pieces W conveyed through the cell Z must be either anodically or cathodically contacted. This contacting is undertaken via endlessly circulating contacting drives K arranged at both sides of the throughput path D and on which the lateral edge regions of the plate-shaped work pieces W lie.

It may be clearly seen in the schematic illustration of FIG. 1 that the endlessly circulating contacting drives K are guided via the afore-mentioned pinch rollers Aq and via a greater number of guide rollers U such that they proceed exactly in the direction of the throughput path D in the region of the cell Z, enter into a first cleaning means R1 via a first seal element Do1 following the output-side pinch rollers Aq, then subsequently pass through a second cleaning means R2, a third cleaning means R3 and a fourth cleaning means R4 and then reenter the cell Z via a second seal element Do2 prior to the input-side pinch rollers Aq. The feed of the anode current or cathode current occurs via a contact element Ko fashioned as a contact roller or contact drum that, for example, is composed of CrNi 18.10 and is arranged immediately in front of the second seal element Do2 in the running direction. The contact element Ko is also connected to a drive motor (not visible in detail in FIG. 1) in order to drive the contacting drives K and, thus, to also convey the plate-shaped work pieces W through the cell Z.

The cleaning means R1 is provided for the chemical removal of the lacquer deposited on the contacting drive K in the cell Z. To this end, the contacting drive K is guided meander-like inside the cleaning means R1, so that it can be charged with the appropriate chemical delacquering means, for example with sulfuric acid, from both sides via a plurality of spray nozzles Sd arranged following one another. After this chemical delacquering, residues of the delacquering means are rinsed off using water in the cleaning means R2, R3 and R4 arranged following one another under the collecting tank Aw. This assures that the contacting drive K in the region of the contacting element Ko and upon reentry into the cell Z is completely free of both the deposited lacquer as well as the chemical delacquering means. A faultless anodic or cathodic contacting of the traversing, plate-shaped work pieces W is then guaranteed with the metallically bare contacting drive K.

Figure 2:
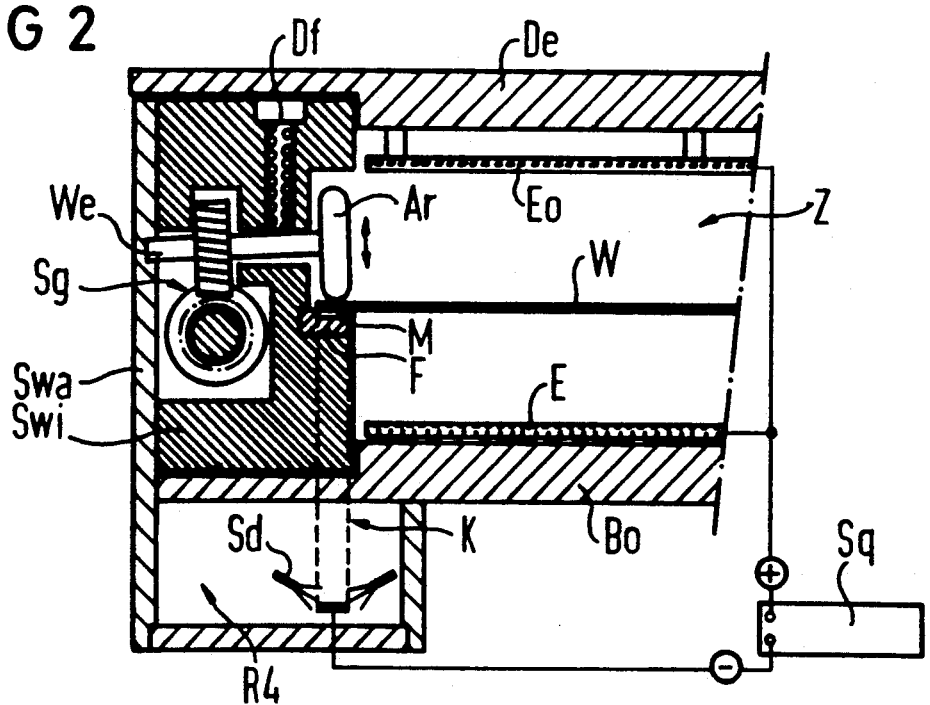
FIG. 2 is a partial cross-sectional view through an apparatus constructed according to the principle shown in FIG. 1.

FIG. 2 shows a cross section through the left-hand region (as seen in the throughput direction) of an apparatus constructed according to the principle shown in FIG. 1 for electrophoretic application of a lacquer onto printed circuit boards or plate-shaped work pieces W. The right-hand part of this means (not shown) is constructed as an exact mirror image of the left-hand part. It may be seen that the cell Z is formed by inside side walls Swi, outside side walls Swa, a hingeable cover De and a fixed floor Bo, whereby all of these parts are composed of electrically insulating material such as, for example, polyvinylchloride (PVC), polyethylene (PE), or polypropylene (PP). An upper electrode Eo suspended at the cover De and a lower electrode Eu secured to the floor Bo are also depicted in FIG. 2, both of these electrodes being horizontally aligned and, for example, being composed of CrNi 18.10 or of titanium. In the illustrated exemplary embodiment, the electrodes Eo and Eu (as anodes) are connected to the positive pole of a schematically illustrated current source Sq whose negative pole is connected to the contacting drive K, formed here by a metal band M, via contact elements (not shown in detail) such as contact rollers, contact drums or contact brushes. This flexible metal band M composed, for example, of CrNi 18.10 is, for example, 10 mm wide and 0.5 mm thick. The guidance of the metal band M inside the cell Z occurs via a horizontal guide F fashioned as a ledge and connected to the inside side wall Swi. This horizontal guide F, for example, is also composed of high-molecular PE in order to guarantee good gliding properties.

The plate-shaped work pieces W having their lateral edge regions lying on the metal bands M inside the cell Z are pressed against the metal bands M and against the guides F via a plurality of pressure rollers Ar of electrically insulating material that are arranged in succession in the throughput direction. The pressing force is provided by compression springs Df that are arranged in bores (not referenced in detail) in the inside side walls Swi and that act on the obliquely placed shaft We of the pressure rollers Ar. As a result of this oblique placement, a sag inside the cell Z is at least largely prevented given thin work pieces W, particularly in the case of the flexible inside layers of printed circuit boards. In order to form an additional drive for the work pieces W, the shafts We of the pressure rollers Ar are driven via worm gearings Sg that are arranged in recesses (not referenced in detail) in the inside side walls Swi and that are composed of electrically insulating material.

The cross section shown in FIG. 2 also shows the arrangement of a fourth cleaning means R4 under the cell Z that has already been described in conjunction with FIG. 1. It may also be seen that spray nozzles Sd for rinsing the contacting drive K are used in this cleaning means R4.

Alternatively to the pressure rollers Ar shown in FIG. 2, the plate-shaped work pieces W could also be guided between two metal bands. For producing a pressing force, the upper metal band could then glide on a correspondingly spring-borne guide.

The apparatus set forth in conjunction with FIGS. 1 and 2 can be used for the electrophoretic application of etching resist, plating resist and solder resist on printed circuit boards, whereby both an anodic as well as a cathodic electro-dip coating are possible. A lacquer deposition bath that is suitable for the application of plating resists onto printed circuit boards is marketed by the Shiply Company under the trademark "Eagle".

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An apparatus for electrophoretic application of a lacquer onto plate-shaped work pieces, comprising:
    a cell containing a lacquer deposition bath liquid;
    at least one electrode arranged in the cell and having a polarity opposite the work pieces that are anodically or cathodically contacted;
    a conveyor means for conveying the work pieces through the cell along a horizontal throughput path;
    at least one endless contacting drive circulating synchronously with the work pieces for the anodic or cathodic contacting of the traversing work pieces;
    at least one contact element arranged outside the cell for a feed of anode current or cathode current to the contacting drive; and
    at least one cleaning means arranged outside the cell for removing lacquer that is deposited on the contacting drive in the cell, said at least one contact element being located outside the cell following the cleaning means in a circulating direction of the endless contacting drive.

2. The apparatus according to claim 1, wherein the bath liquid is circulated through the cell.

3. The apparatus according to claim 2, wherein the bath liquid is circulated through a bath liquid container arranged outside the cell.

4. The apparatus according to claim 3, wherein the bath liquid from the bath liquid container is separately returned into a region of the cell lying above the throughput path and into a region of the cell lying under the throughput path.

5. The apparatus according to claim 1, wherein the apparatus further comprises pinch rollers at a discharge side of the cell.

6. The apparatus according to claim 1, wherein the cell is closed with a cover.

7. The apparatus according to claim 1, wherein at least one upper electrode is arranged in the cell above the throughput path and at least one lower electrode is arranged in the cell under the throughput path.

8. The apparatus according to claim 1, wherein the contacting drive is driven and thereby forms the conveyor means.

9. The apparatus according to claim 1, wherein the apparatus has at least two contacting drives and wherein the contacting drives are arranged at respectively both sides of the throughput path.

10. The apparatus according to claim 1, wherein the contacting drive is formed by one of a metal band and a metal cable.

11. The apparatus according to claim 1, wherein the contacting drive slides on a horizontally arranged guide in a region of the cell.

12. The apparatus according to claim 1, wherein at least one pressure element is arranged in the cell, said at least one pressure element pressing the traversing work pieces against the contacting drive.

13. The apparatus according to claim 12, wherein the pressure element is a pressure roller.

14. The apparatus according to claim 13, wherein the pressure roller is positioned obliquely such that a sag of thin work pieces is prevented.

15. The apparatus according to claim 13, wherein the pressure roller is driven to thereby form an additional conveyor means.

16. The apparatus according to claim 1, wherein the contact element is a rotatably seated contact roller or contact drum.

17. The apparatus according to claim 1, wherein a chemical delacquering of the contacting drive is undertaken in at least one first cleaning means.

18. The apparatus according to claim 17, wherein the chemical delacquering is undertaken by spray nozzles directed onto the contacting drive.

19. The apparatus according to claim 17, wherein the at least one first cleaning means for the chemical delacquering is followed by at least one second cleaning means for rinsing the contacting drive.

20. The apparatus according to claim 19, wherein the at least one second cleaning means for rinsing the contacting drive has spray nozzles for applying a rinse agent to the contacting drive.

21. The apparatus according to claim 1, wherein the apparatus further comprises means for providing a meander-like guidance of the contacting drive in a region of the at least one cleaning means.

* * * * *